United States Patent
Jiang et al.

(10) Patent No.: US 6,582,994 B2
(45) Date of Patent: *Jun. 24, 2003

(54) PASSIVATION LAYER FOR PACKAGED INTEGRATED CIRCUITS

(75) Inventors: Tongbi Jiang, Boise, ID (US); Zhiping Yin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/955,846

(22) Filed: Sep. 18, 2001

(65) Prior Publication Data

US 2002/0022305 A1 Feb. 21, 2002

Related U.S. Application Data

(60) Continuation of application No. 09/392,201, filed on Sep. 8, 1999, now Pat. No. 6,316,285, which is a division of application No. 09/145,106, filed on Sep. 2, 1998.

(51) Int. Cl.⁷ ............................................. H01L 21/44
(52) U.S. Cl. ...................................... 438/127; 438/106
(58) Field of Search ................................ 438/106, 112, 438/124, 126, 127

(56) References Cited

U.S. PATENT DOCUMENTS

| | | | |
|---|---|---|---|
| 3,706,840 A | * 12/1972 | Moyle et al. | 174/52 PE |
| 4,459,338 A | * 7/1984 | Angelini et al. | 428/404 |
| 4,978,914 A | * 12/1990 | Akimoto et al. | 324/158 F |
| 4,996,587 A | 2/1991 | Hinrichsmeyer et al. | |
| 5,222,014 A | 6/1993 | Lin | |
| 5,589,319 A | * 12/1996 | Katou et al. | 430/288.1 |
| 5,693,565 A | * 12/1997 | Camilletti et al. | 437/192 |
| 5,811,879 A | 9/1998 | Akram | |
| 5,885,751 A | * 3/1999 | Weidman et al. | 430/315 |
| 5,956,605 A | * 9/1999 | Akram et al. | 438/613 |
| 5,989,940 A | * 11/1999 | Nakajima | 438/127 |
| 6,090,530 A | 7/2000 | Weidman et al. | |
| 6,159,871 A | * 12/2000 | Loboda et al. | 438/786 |
| 6,316,285 B1 | * 11/2001 | Jiang et al. | 438/106 |

OTHER PUBLICATIONS

Biederman et al., plasma Polymerization Processes (Amsterdam and New York: Elsevier Science) 183–203.
Brochure, Parylene Conformal Coatings:, Para Tech Coating, Inc. Aliso Viejo, CA.
O. Joubert et al., "Plasma Polymerized all–dry resist process for 0.25μm photolithography", J. Vac. Sci. Technol B., vol. 12, No. 6, Nov./Dec. 1994, pp. 3909–3913.
Stechelmacher, Walter. Rev. of Plasma Polymerization Processes: Plasma Technology, vol. 3, Hynek Biederman and Yoshihito Osada. Vacuum. vol: 46 Issue: 12, Dec. 1995, pp. 1474.
Wolf et al., "Silicon Processing For The VLSI Era", 1986, vol. 1, p. 171.*

* cited by examiner

*Primary Examiner*—Kamand Cuneo
*Assistant Examiner*—Scott Geyer
(74) *Attorney, Agent, or Firm*—Knobbe, Martens, Olson & Bear, LLP

(57) ABSTRACT

Passivating layers methods for forming the same are provided for packaged integrated circuit devices. In particular, an integrated circuit die is mounted in a plastic leaded chip carrier, and a photosensitive material is then deposited over the surfaces to be passivated. Portions of the photosensitive material are then exposed to UV light, resulting in a crosslinked siloxane network. In this way, a low-temperature photodefinable passivation layer is provided for the package, with characteristics similar to conventional oxides. Advantageously, the photosensitive material can be patterned during the UV exposure, and unexposed portions selectively removed to leave the passivation layer only over desired portions of the package.

22 Claims, 4 Drawing Sheets

PASSIVATION LAYER FOR PACKAGED INTEGRATED CIRCUITS

REFERENCE TO RELATED APPLICATIONS

The present application is a continuation of allowed application Ser. No. 09/392,201, filed Sep. 8, 1999 now U.S. Pat. No. 6,316,285, which is a divisional of application Ser. No. 09/145,106, filed Sep. 2, 1998.

BACKGROUND OF THE INVENTION

1. Field of the Invention

The present invention relates to passivation layers for packaged dies and methods for forming the same.

2. Description of the Related Art

Die carriers are used in the construction of integrated circuit chips or dies to connect such dies to larger circuits, such as the motherboard of personal computers. In the past, die carriers, such as lead frames, have been most commonly metal. After mounting the die of the die carrier and connecting the leads, passivation layers are generally formed over the mounted die and carrier to protect the chips from moisture, chemicals, and other environmental factors.

Passivation layers can be formed on lead frames using chemical-vapor deposition and thermal processes at relatively high temperatures, due to the high melting point of the metal. Recently, however, plastic has become more widely used in die carriers. Due to the low melting point of plastics, such die carriers are easily damaged by exposure to high temperature steps.

Consequently, there is a need for a process for forming a protective layer on integrated circuit devices and other surface mounted structures at lower temperatures. Desirably, the passivation layers formed by the process should be moisture resistant and protect the underlying die.

SUMMARY OF THE INVENTION

In accordance with one aspect of the invention, a process for forming a passivated integrated circuit device is provided. The process includes mounting a die onto a surface of a die carrier. An organosilane precursor is reacted to form a layer of photosensitive material on surfaces of the die and the die carrier.

In accordance with another aspect of the invention a method is disclosed for packaging an integrated circuit die to form a surface mount device. The method involves mounting the die onto a surface of a plastic die carrier. A photodefinable layer is deposited on the die and the die carrier after mounting the die. This photodefinable is then converted to a passivation layer.

In accordance with another aspect of the invention, a method is provided for packaging an integrated circuit die for surface mounting. The die is mounted on a die carrier. A layer of plasma polymerized methylsilane (PPMS) is deposited onto a first side of the die and die carrier after mounting the die. At least a portion of the PPMS is then exposed to ultraviolet (UV) light in the presence of oxygen.

In accordance with still another aspect of the invention, a packaged integrated circuit device is provided. The device includes a die carrier, with an integrated circuit die mounted onto a surface of the die carrier. A passivation layer, including plasma polymerized methylsiloxane (PPMSO), extends over portions of the die and the die carrier.

In an illustrative embodiment of the invention, reacting methylsilane in a plasma enhanced CVD reactor leaves a layer of PPMS. Advantageously, this layer is formed at low temperatures, and then converted by exposure to UV light to the oxide-like passivation layer of PPMSO. The low temperatures of the process enables passivation of die carriers having plastic substrates, such as a plastic ball grid array.

BRIEF DESCRIPTION OF THE DRAWINGS

These aspects and others will be apparent from the following description of preferred embodiments and the accompanying drawings, which are meant to illustrate and not to limit the invention, wherein.

DETAILED DESCRIPTION OF THE PREFERRED EMBODIMENT

Figure 1A:
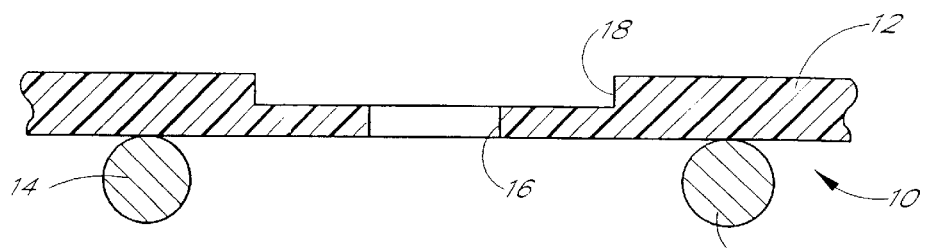
FIG. 1A is a cross-sectional view showing a plastic die carrier according to an illustrative embodiment.

A process for forming a passivation layer on a packaged substrate according to an illustrative embodiment of the present invention will be described while referring to the accompanying drawings. Like parts and components are designated by the same reference numerals for the reader's ease. The drawings are schematic and not to scale.

Figure 1B:
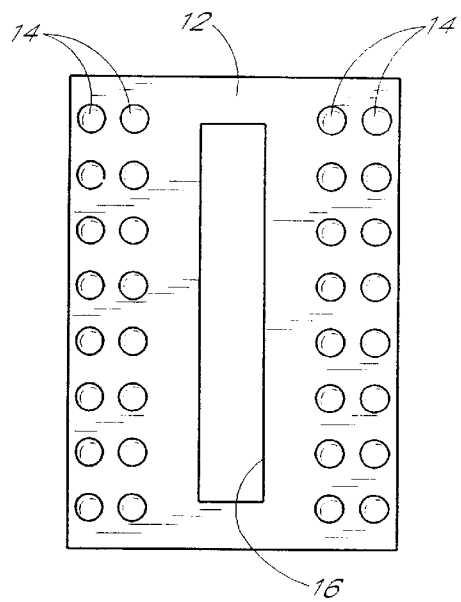
FIG. 1B is a plan view of a taped front side of die carrier of FIG. 1.

FIGS. 1A and 1B show a die carrier 10 according to a first preferred embodiment. The die carrier preferably comprises a plastic substrate having wire traces formed therein. Use of plastic substrates, such as FR-4 commonly used for printed circuit boards, enables scaling of the chip or die package, due to the ability to print fine wire traces between plastic layers. As a result, plastic carriers allow integration of the chip to a printed circuit board while adding no more than about 20% to the size of the chip itself, such that the carrier and die together are said to present a chin scale package.

The illustrated die carrier 10 comprises a plastic ball grid array ("PBGA"), preferably comprising a BT resin plastic substrate 12 with surface solder balls 14 electrically connected to conductive traces within the substrate. While not shown, it will be understood that the traces can be formed within or at the surface of the substrate 12. The illustrated carrier 10 includes a window 16 formed within a die recess 18. The skilled artisan will recognize numerous other carrier configurations suitable for mounting dies to circuit boards.

Figure 2:
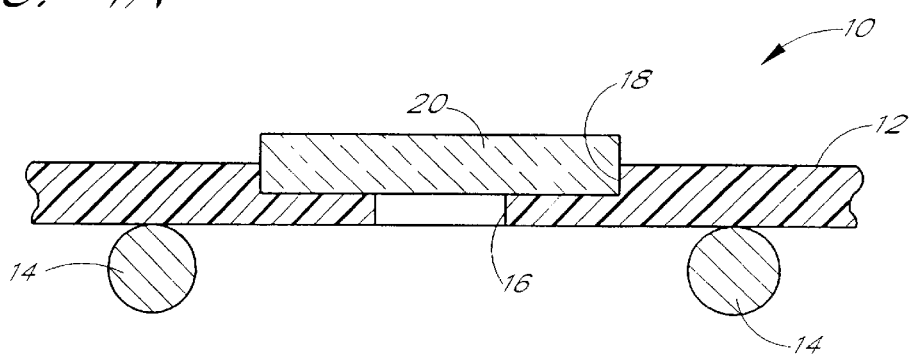
FIG. 2 illustrates a die mounted on a back side of the die carrier of FIG. 1.

As shown in FIG. 2, a die 20 is mounted within the recess 18, preferably on the surface of the die carrier opposite the side on which the solder balls 14 are formed. The side of the substrate 12 on which the die 20 is mounted is typically referred to as the "die side" or "back side" of the carrier 10. The opposite side of the substrate 12, on the other hand, is typically referred to as the "lead side" or "front side" of the substrate 12, which includes the solder balls 14 in the illustrated PBGA embodiment. The die 20 can comprise an integrated circuit, such as a memory chip, a microprocessor, a photodiode or other chips designed for specific purposes.

Figure 3:
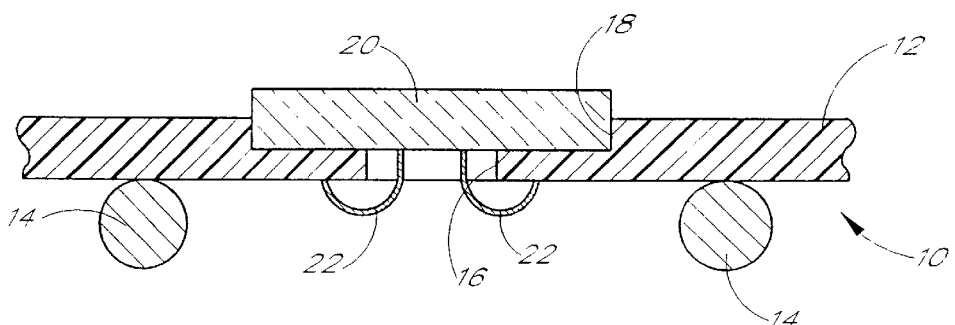
FIG. 3 shows the die carrier of FIG. 1 after leads have been attached to the die and the die carrier on a front side.

As shown in FIG. 3, leads 22 are attached to each of the die 20 and the substrate 12. In particular, the illustrated leads 22 comprise wire bonds extending from contacts on the die 20 to conductive traces of the carrier 10 within or at the surface of the substrate 12. Wire bonding or other methods of connecting an integrated circuit to the die carrier are well known in the art, and need not be discussed in detail here.

Figure 4:
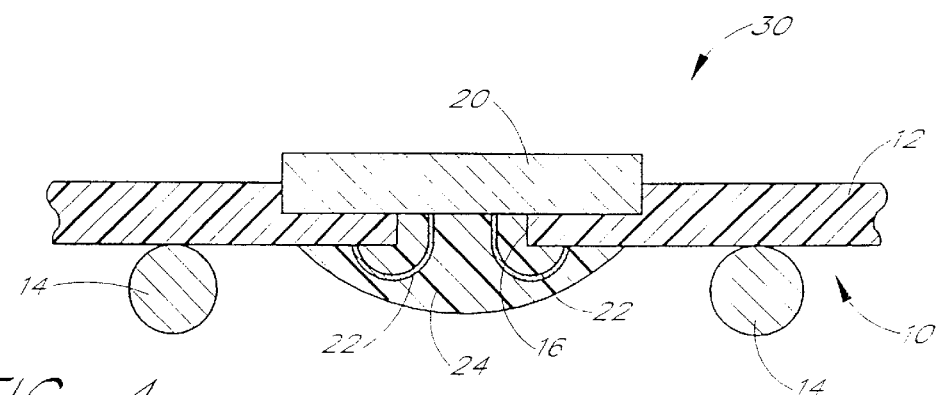
FIG. 4 shows the die carrier after epoxy is deposited on the front side to envelope the leads.

As shown in FIG. 4, the leads 22 and the portion of front side of the die 20 which is exposed through the window are then covered by a protective material 24. The protective material 24 preferably comprises an epoxy deposited onto the front side of the carrier 10 such that it envelopes the leads 22 and seals the window 16. Such protective epoxies are often referred to in the industry as "glob tops." A die packaged in this manner may be described as an integrated circuit device 30, including the die 20 leaded to the die carrier 10. The IC device 30 can be surface mounted on a larger printed circuit board, as will be apparent from the discussion below of FIG. 7.

Figure 5:
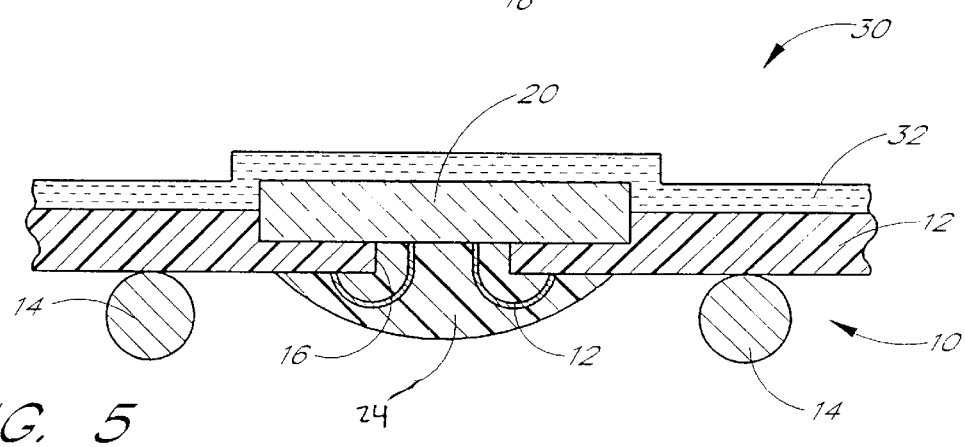
FIG. 5 shows the die carrier after depositing a photosensitive material over the back side of the die and die carrier.

As shown in FIG. 5, after the die 20 is mounted on the die carrier 10, a layer of photosensitive material 32 is deposited on the back or die side surface of the packaged die 30. In the illustrated embodiment, the layer 32 is deposited by reacting an organosilane precursor, such as methylsilane ($CH_3SiH_3$), in a plasma enhanced chemical vapor deposition (PECVD) process. Desirably, the substrate can be maintained under about 300° C. during the deposition. In contrast, conventional oxide passivation layers are formed at higher temperatures (e.g., CVD at 300° C. to 500° C., or thermal oxidation at 600° C. to 700° C.). The preferred organosilane can be reacted in a plasma deposition chamber between about 75° C. and 150° C., more preferably, between about 90° C. and 140° C.

Other preferred parameter ranges includes chamber pressures between about 1 Torr and 2.5 Torr, with an exemplary value of about 1.72 Torr; organosilane gas flow rate between about 40 sccm and 150 sccm, with an exemplary value of about 66 sccm; electrode spacing between about 400 mils and 550 mils, with an exemplary value of about 450 mils; and power between about 50 W and 200 W, with an exemplary value of about 100 W. Preferably, a non-reactive carrier gas flow is also included in the process. In the exemplary implementation, addition of a helium gas flow of about 1,000 sccm to 3,000 sccm to the deposition process was found to increase the uniformity of deposited film. The skilled artisan will recognize that parameters can fall outside these preferred ranges under different conditions, such as different plasma chambers.

Thickness of the deposited layer can be varied according to the specific applications. A typical deposition rate is about 2,000 Å/min. The organosilane precursor in the illustrative embodiment undergoes fragmentation and condensation to form a thin, amorphous film of plasma polymerized methylsilane ("PPMS") 32.

Figure 6A:
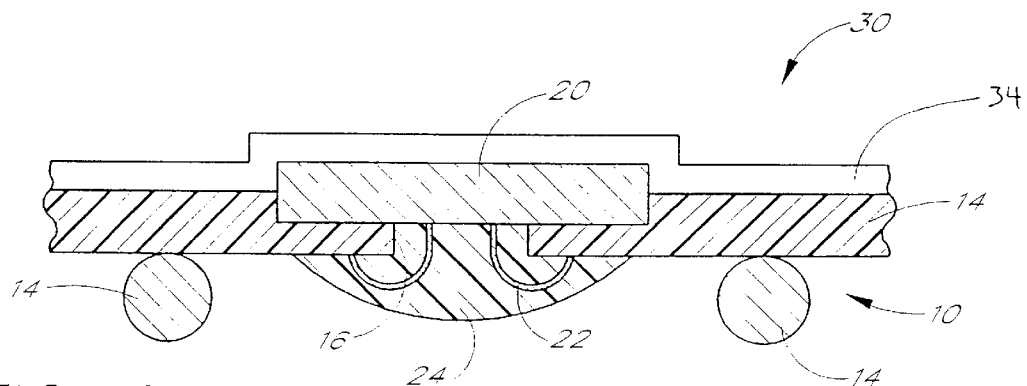
FIG. 6A shows the die carrier of FIG. 5 after exposure of the photosensitive material to developing light.

FIG. 6A illustrates the device 30 of FIG. 5 after the PPMS film 32 is photo-oxidized to form a crosslinked siloxane network, or "PPMSO" 34. Preferably, crosslinking occurs by exposure of the PPMS 32 (FIG. 5) to deep ultraviolet (UV) light in air or other oxygen environment. Sources of deep UV light are widely available in commercial steppers at wavelengths of 193 nm or 248 nm. The PPMSO layer 34 comprises an oxide-like material incorporating carbon and hydrogen, of the form $SiO_x$:C:H, where x is less than or equal to about 2, and the ratio of carbon to silicon is less than about 1. This material etches at about the same rate as silicon dioxide, and is similarly moisture and abrasion resistant.

Thus, the cross-linking produced by UV exposure results in a robust, moisture-resistant protective or passivation layer 34. The siloxane network acts as a mechanical and chemical protection layer for the packaged die to protect it from physical and environmental attack. At the same time the siloxane network electrically insulates and passivates the circuitry while providing thermal expansion and other properties which are compatible with oxide layers (e.g., passivation or interlevel dielectrics) formed within the die itself.

Advantageously, the PPMS film 32 (FIG. 5) can be patterned during exposure to UV light and further dry developed in a halogen-based plasma to remove unoxidized organosilane material. The PPMS film 32 is thus said to be photodefinable. As will be apparent from the discussion below of FIG. 9A, for example, it may be desirable to passivate only the die, or only undesirably exposed traces on the die carrier. The process of depositing an organosilane precursor onto a substrate through plasma polymerization and exposing the precursor to UV light to form a crosslinked siloxane network has been discussed in the context of dry photoresist masks in the fabrication of integrated circuits. O. Joubert et al., *Plasma Polymerized All-Dry Resist Process for 0.25 µm Photolithography,* 12 J. Vac. Sci. Technol. B. 3909 (1994). The disclosure of Joubert is hereby incorporated by reference.

Figure 6B:
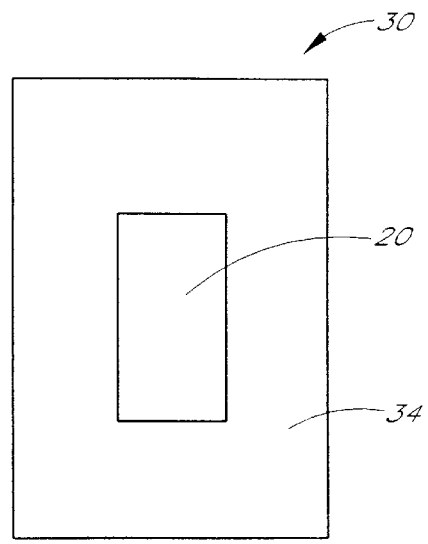
FIG. 6B is a plan view of the back or die side of the die carrier of FIG. 6A.

FIG. 6A thus shows the completed packaged die 30, with a passivation layer 34 covering the back side of the die 20 and the substrate 12, and wire bonds 22 on the front side electrically connecting the die 20 into the printed circuit of the die carrier 10. The wire bonds 22 and the front side of the die 20 (otherwise exposed to the aperture 16) are protected at the front side by the glob top 24. FIG. 6B shows the back side of the passivated packaged die 30. In this view the die 20 is visible through the crosslinked siloxane passivation layer 34.

Figure 7:
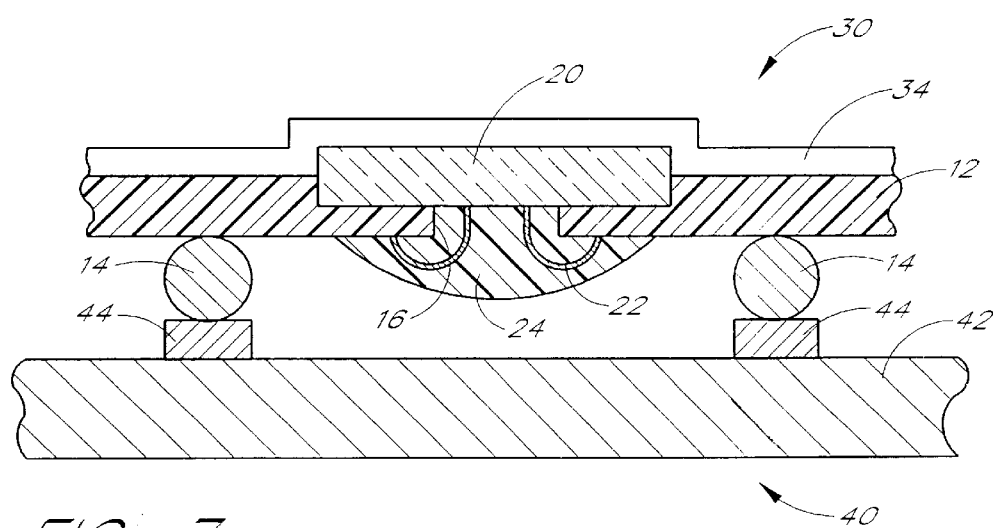
FIG. 7 is a cross-sectional view showing the passivated die carrier mounted on the surface of a printed circuit board.

As shown in FIG. 7, the packaged die 30 is thus ready to be mounted into a larger circuit. FIG. 7 shows the packaged die or integrated circuit device 30 mounted to a printed circuit board (PCB) 40, such as the motherboard of a personal computer. The PCB 40 comprises a plastic substrate 42 having circuit traces or bond pads 44 designed to electrically communicate with the packaged die 30. The illustrated plastic ball grid array (PBGA) is flip-chip mounted with the front side down, the solder balls 14 aligned with the contacts 44 of the PCB 40. Such surface mounting of integrated circuit packages is well known in the art and need not be elaborated upon here.

Figure 8:
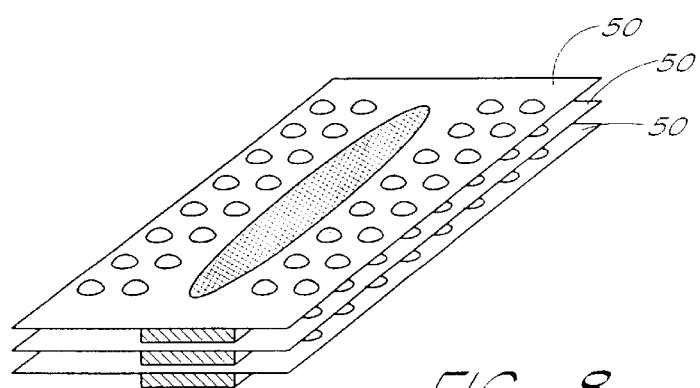
FIG. 8 is a perspective view of stacked die carriers in accordance with a second embodiment.

With reference now to FIG. 8, the plurality of packaged dies or integrated circuit devices 50 are illustrated stacked upon one another, in accordance with a second preferred embodiment. Such stacked packages are described, for example, in U.S. patent application Ser. No. 09/072,101, filed May 4, 1998, entitled "Stackable Ball Grid Array Package," and assigned to the assignee of the present application. The disclosure of the '101 application is hereby incorporated by reference.

Figure 9A:
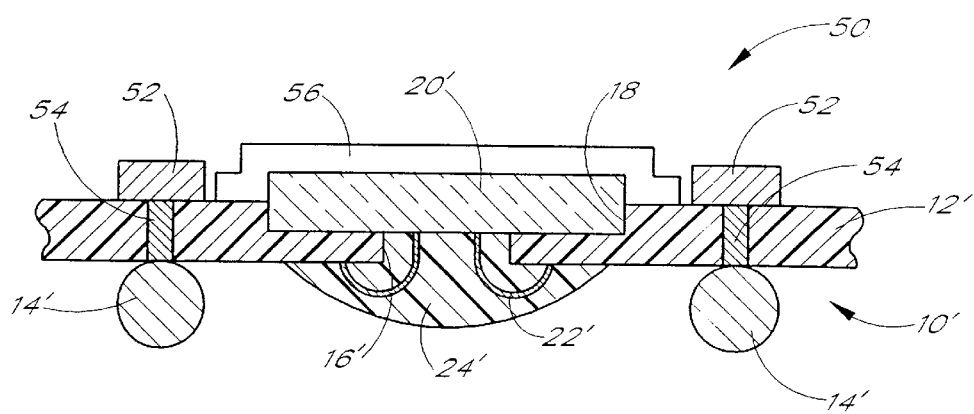
FIG. 9A shows one of the die carriers of FIG. 8, with a patterned passivation layer constructed in accordance with the second embodiment.
Figure 9B:
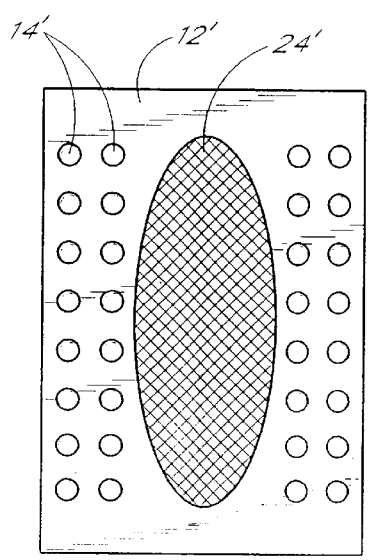
FIG. 9B is a plan view of the front or lead side of the die carrier of FIG. 9A.
Figure 9C:
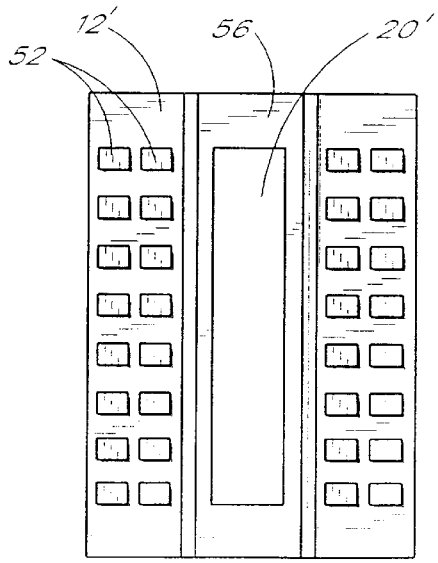
FIG. 9C is a plan view of the back or die side of the die carrier of FIG. 9A.

FIG. 9A illustrates one such stackable integrated circuit device 50. As with the previous embodiment, the packaged die 50 can include a plastic substrate 12', solder balls 14', aperture 16', die 20' mounted within a die recess 18', wire bonds 22' and glob top 24', such that the similar reference numerals are used as in the previous embodiment, with a prime (') designation. In addition to these elements, however, the die carrier 10' of the packaged die 50 includes solder ball pads 52 on the back side of the plastic substrate 12', opposite to the solder balls 14'. The solder ball pads 14' are electrically connected through the substrate 12' to the solder ball pads 52. While that electrical connection is schematically illustrated in FIG. 9A with a contact 54 extending through the substrate 12', the skilled artisan will understand that, in reality, the connection may be through a complex of wiring layers through the plastic substrate 12', rather than through an aligned contact. Additionally, the electrical contacts on either side of the substrate can be configured in a number of manners other than the illustrated solder balls and pads.

In stacking the packaged dies 50 upon one another the solder balls 14' of one die carrier 10' must electrically contact the solder ball pads 52 of a second die carrier 10'. Accordingly, insulating passivation of the back side of the die 20' should not extend over the solder ball pads 52. Accordingly, as shown, a patterned passivation layer 56 is formed over the die 20' and seals the juncture of the die 20' with the plastic substrate 12'. The patterned passivation layer 56 does not extend over the solder ball pads 52.

As described with respect to the previous environment, the patterned passivation layer 56 can be formed by depositing a layer of PPMS and exposing the PPMS to deep UV light. During the exposure step, however, the portion of the PPMS exposed to the UV light can be confined to that area in which passivation is desired, in keeping with conventional photolithographic principles As disclosed in the Joubert reference, incorporated by reference above, the portions of the PPMS over which passivation is not desired (e.g., the solder ball pads 52) are not exposed to the UV light. The oxide-like PPMSO passivation layer 56 is thus formed only where desired, leaving PPMS over the solder ball pads 52.

The unexposed portions of the PPMS layer can thereafter be developed by exposure to a dry halide plasma treatment. An exemplary chlorine plasma treatment to develop unexposed PPMS comprises flowing about 80 sccm of chlorine gas under a pressure of about 2 mTorr, with RF power set at about 1 kW. Exposure to this chlorine plasma removes the unexposed PPMS, while leaving the exposed PPMSO passivation layer 56 unharmed. Accordingly, the solder ball pads 52 remain exposed and available for contact with solder balls 14' from an overlying packaged substrate 50. The skilled artisan will recognize other packaging schemes in which a photodefinable passivation layer over the die will be advantageous.

Although, this invention has been described in terms of certain preferred embodiments and suggested possible modifications thereto, other embodiments and modifications may suggest themselves and be apparent to those of ordinary skill in the art. Such modifications are intended to also fall within the spirit and scope of the present invention, which is accordingly defined by the claims which follow.

We claim:

1. A process for forming a passivated integrated circuit device, comprising:

mounting a die onto a surface of a die carrier; and reacting an organosilane precursor to form a layer of photosensitive material onto surfaces of the die and the die carrier.

2. The process of claim 1, further comprising exposing the photosensitive material to UV light and exposing the photosensitive material to oxygen.

3. The process of claim 1, wherein the organosilane, precursor comprises methylsilane.

4. The process of claim 3, whereing reacting the organosilane comprises flowing between about 40 sccm and 150 sccm of methlysilane and between about 1,000 sccm and 3,000 sccm of helium.

5. The process of claim 1, wherein the die carrier comprises a plastic substrate.

6. The process of claim 5, wherein reacting the organosilane comprises maintaining a temperature below about 150° C.

7. The process of claim 5, wherein the plastic substrate comprises a BT resin.

8. The process of claim 1, wherein the die carrier comprises a plastic ball grid array.

9. A method of packaging an integrated circuit die to form a surface mount device, comprising:

mounting the die onto a surface of a plastic die carrier; and depositing a photodefinable layer on the die and the die carrier after mounting the die; and converting the photodefinable layer to a passivation layer.

10. The method of claim 9, wherein depositing and converting are each conducted at temperatures of less than about 300° C.

11. The method of claim 10, wherein depositing the photodefinable layer comprises reacting methylsilane at between about 90° C. and 140° C.

12. The method of claim 9, wherein the die carrier comprises a plastic ball grid array.

13. The method of claim 9, wherein the die carrier comprises a stackable integrated circuit die package.

14. The method of claim 9, wherein the photodefinable layer comprises plasma polymerized methylsilane.

15. The method of claim 9, wherein the die carrier comprises a printed circuit.

16. The method of claim 9, wherein the die carrier comprises a substrate formed of BT resin.

17. A method of packaging an integrated circuit die for surface mounting, the method comprising:

mounting the die on a die carrier;

forming plasma polymerized methylsilane (PPMS) onto a back side of the die and die carrier after mounting the die; and exposing at least a portion of the PPMS to ultraviolet light in the presence of oxygen.

18. The method of claim 17, wherein the die carrier comprises a plastic substrate.

19. The method of claim 18, wherein the die carrier comprises a BT resin.

20. The method of claim 17, further comprising electrically connecting the die to wiring within the die carrier after mounting the die on the die carrier.

21. The method of claim 20, wherein electrically connecting comprises forming wire bonds between the die and die carrier through an aperture on the front side of the die carrier.

22. The method of claim 21, further comprising depositing an epoxy over the wire bonds and into the aperture.

* * * * *